United States Patent [19]

Siebold et al.

[11] 4,420,706
[45] Dec. 13, 1983

[54] CONNECTOR ASSEMBLY FOR A PIEZOELECTRIC TRANSDUCER

[75] Inventors: Donald J. Siebold, Naperville; Michael K. Troy, Westmont; William R. Lenz, Crestwood, all of Ill.

[73] Assignee: Molex Incorporated, Lisle, Ill.

[21] Appl. No.: 335,071

[22] Filed: Dec. 28, 1981

Related U.S. Application Data

[63] Continuation of Ser. No. 138,088, Apr. 7, 1980, abandoned, which is a continuation of Ser. No. 3,477, Jan. 15, 1979, abandoned.

[51] Int. Cl.³ .............................................. H01L 41/08
[52] U.S. Cl. ................................ 310/324; 179/110 A; 310/322
[58] Field of Search ............... 310/321, 322, 324, 348, 310/354–356; 179/110 A; 339/17 R, 17 C, 17 CF

[56] References Cited

U.S. PATENT DOCUMENTS

| | | | |
|---|---|---|---|
| 2,761,076 | 8/1956 | Hansell | 310/324 |
| 3,007,013 | 10/1961 | Paull et al. | 179/110 A |
| 4,063,049 | 12/1977 | Pipitone et al. | 179/110 A |
| 4,273,399 | 1/1981 | Myers et al. | 339/17 C |
| 4,295,009 | 10/1981 | Weidler | 179/110 A |

Primary Examiner—Mark O. Budd
Attorney, Agent, or Firm—Louis A. Hecht

[57] ABSTRACT

A connector assembly for electrically connecting a transducer to another circuit member. The transducer is in the form of a thin wafer and has a conductive substrate with a piezoelectric element mounted thereon. The connector assembly generally includes a base means for removably securing the transducer and electrically connecting it to the circuit element.

17 Claims, 7 Drawing Figures

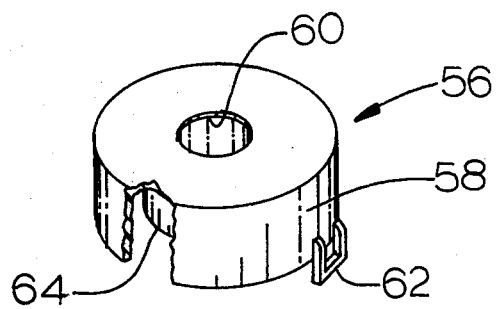
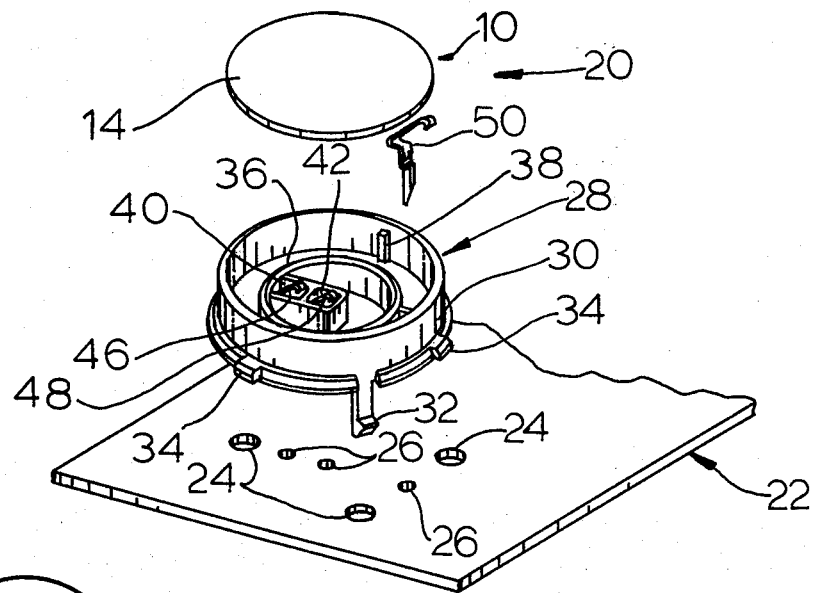
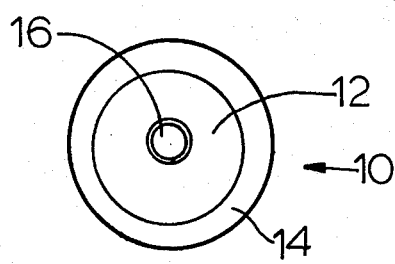
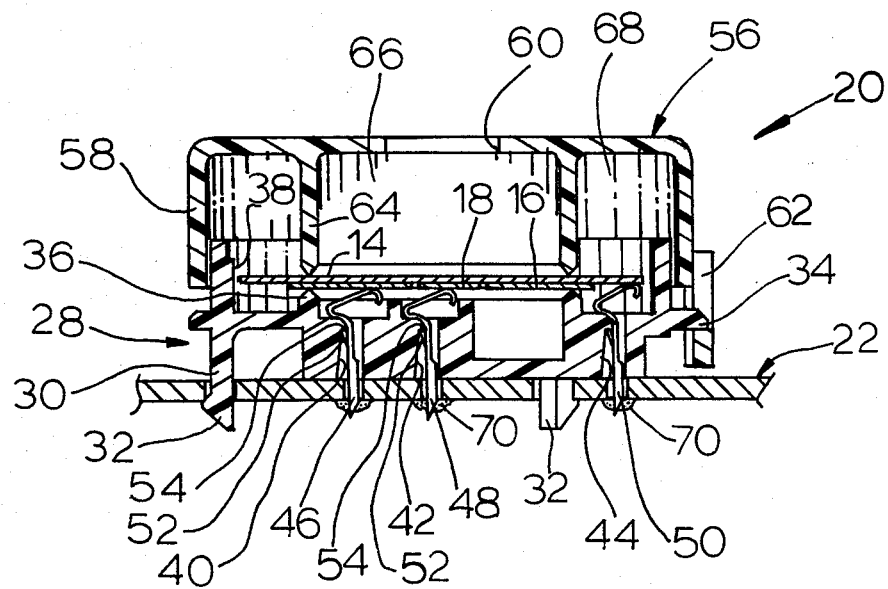

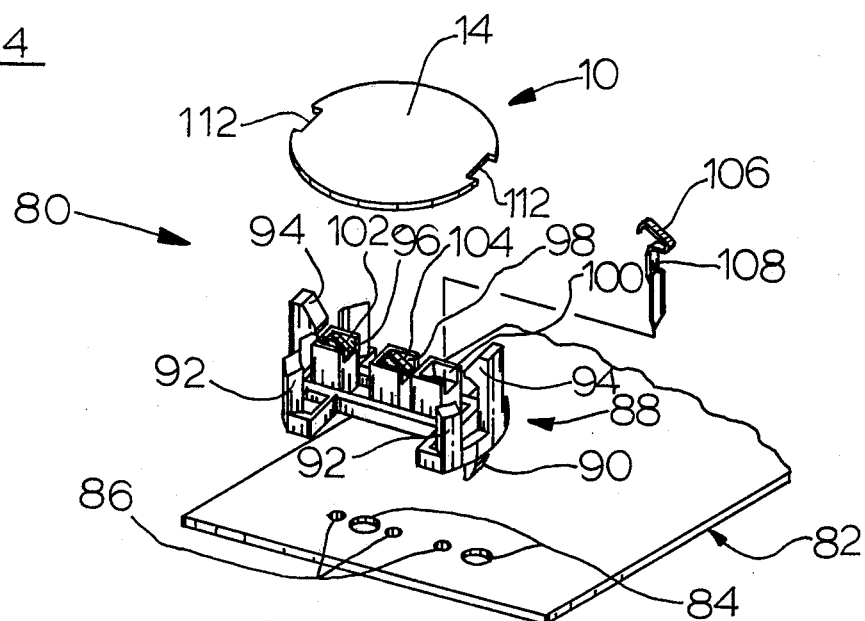
FIG. 4
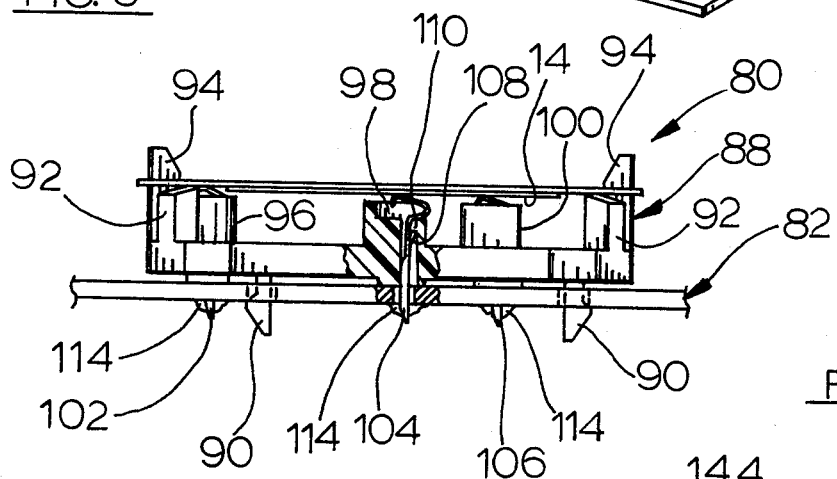
FIG. 5
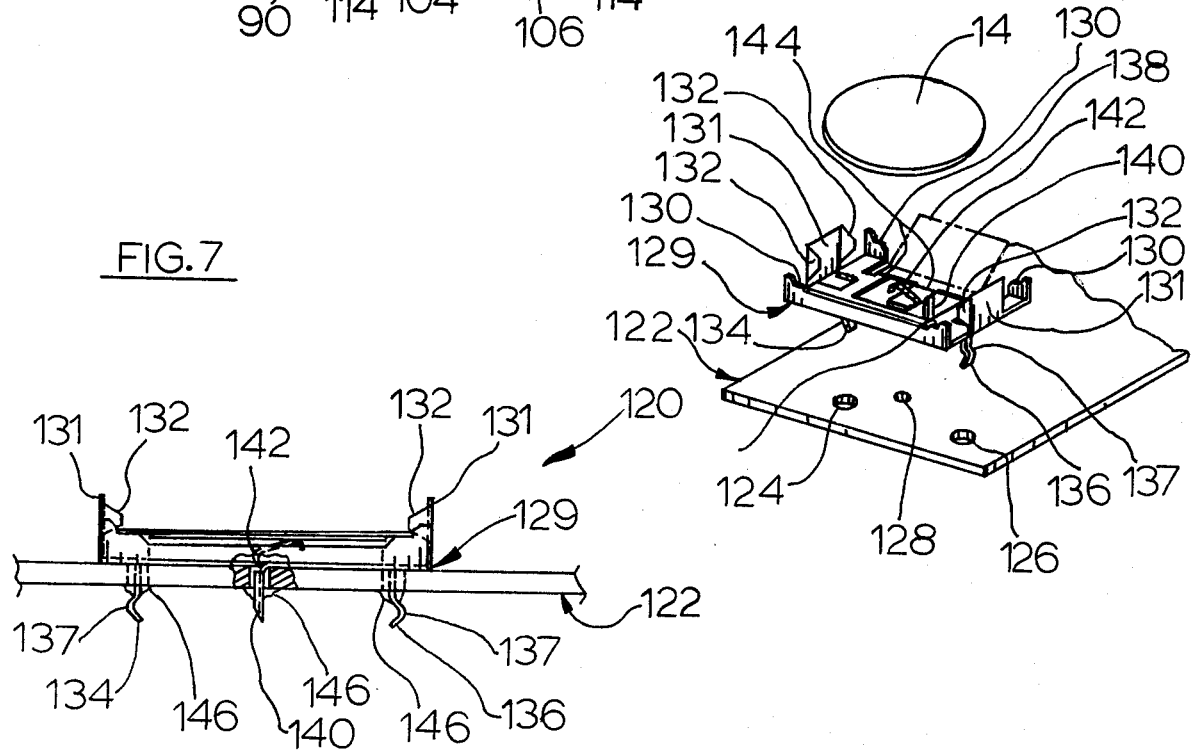
FIG. 6
FIG. 7

CONNECTOR ASSEMBLY FOR A PIEZOELECTRIC TRANSDUCER

This application is a continuation of application Ser. No. 138,088, filed Apr. 7, 1980, which is a continuation of Ser. No. 3,477 filed Jan. 15, 1979, both now abandoned.

BACKGROUND OF THE INVENTION

1. Field of the Invention

The present invention generally relates to accoustic wave devices such as transducers and more particularly to the electric connection of such transducers to other circuit members.

2. Description of the Prior Art

Transducers, which are generally well known in the art, are made of piezoelectric material. When the piezoelectric material is excited such as by an electrical signal, the transducer will vibrate and, in some applications, will produce a noise in response thereto.

In one kind of application, a transducer in the form of a thin piezoelectric element is mounted on a conductive substrate. By connecting an electrical signal to the element and the other to the conductive substrate, the transducer will be driven (or vibrated) at a given frequency.

In order to get a larger sound output from a transducer of this type, the piezoelectric element is divided into two electrically isolated portions. A feedback circuit is then connected to one of the piezoelectric portions as is disclosed in U.S. Pat. No. 3,815,129. This type of assembly using three terminal connections, one to the conductive substrate and one each to the two portions of the piezoelectric element, will produce a much greater sound out put than the conventional manner of attaching a terminal merely to the conductive substrate and one to the piezoelectric element. A representative type of circuit to produce the desired sound is also disclosed in said U.S. Pat. No. 3,815,129, the contents of which are incorporated by reference herein.

In the past, the units which mount an electrically connected transducer of the type described, have a permanent, non-cyclable means of attaching or mounting the transducer to the unit, either by means of a solder connection or some sort of cement. Examples of units of this type as disclosed in U.S. Pat. Nos. 4,013,982 and 3,331,970.

It is found to be desirable for both assembly and manufacturing purposes, to mount a transducer of the type described herein in a non-permanent manner. One example of an assembly which accomplishes this general purpose is disclosed in U.S. Pat. No. 3,885,173. This patent discloses an apparatus which includes a gasket and a housing wherein the gasket is made of resilient material having conducting regions. The gasket is then layed upon a printed circuit board and the transducer is mounted thereover. A housing provides the necessary mechanical coupling for pressing the transducer against the gasket to electrically connect the transducer to the printed circuit board.

Although the apparatus disclosed in U.S. Pat. No. 3,885,173 accomplishes its intended purposes, it is expensive in that it uses an elastomeric gasket and it does not lend itself to easy assembly in an ordinary manufacturing production process.

SUMMARY OF THE INVENTION

It is therefore, the principal object of the present invention to provide a connector assembly for holding and electrically connecting a transducer, having piezoelectric element mounted on a conductive substrate to a circuit member, in a manner which is easy to use, manufacture and still provide selective removability.

One means of providing the desired object is a connector assembly comprising a base means mountable on said circuit member; at least two resilient terminals associated with the base means; and cover means removably mountable on said base means for selectively securing said transducer in contact with said terminal. One of the terminals has an end adapted to be electrically connected to the circuit member and the other adapted to electrically and resiliently contact the conductive substrate. The other terminal has one end adapted to be electrically connected to said circuit member and the other end adapted to electrically and resiliently contact said piezoelectric element.

Another connector assembly accomplishing the above object comprises a base means which is mountable on the circuit member including holding means integrally formed therewith removably securing the transducer to the base means. Two terminals are associated with the base means. One terminal has one end adapted to the electrically connected to said circuit member and the other end adapted to electrically contact the conductive substrate. The other terminal has one end adapted to the electrically connected to said circuit member and the other adapted to electrically and resiliently contact said piezoelectric element. The top of the terminals are a distance greater from the circuit member than the distance that the holding means hold the transducer from the circuit member so that the transducer is pressed in resilient contact against the terminals when secured on the base means by said holding means.

Another embodiment of the connector assembly achieving the desired object generally comprises an integrally formed unitary base means mountable on the circuit member. The base means includes holding means made of electrically conductive material which is adapted to contact the conductive substrate and for removably securing the transducers to the base means, first terminal means electrically connected to said holding means and adapted to be electrically connected to said circuit member, and second terminal means electrically isolated from said first terminal means having one portion adapted to the electrically connected to said circuit member and another portion adapted to electrically and resiliently contact said piezoelectric element.

BRIEF DESCRIPTION OF THE DRAWINGS

FIG. 1 is an exploded partially fragmented perspective view of one embodiment of the connector assembly of the present invention;

FIG. 2 is a plan view showing a transducer disc that may be used in association with the connector assembly of the present invention;

FIG. 3 is a side sectional view of the connector assembly shown in FIG. 1 completely mounted on a circuit member;

FIG. 4 is an exploded perspective view of a second embodiment of the connector assembly of the present invention;

FIG. 5 is a side view, partially in section, showing the connector assembly of FIG. 4;

FIG. 6 is an exploded perspective view of a third embodiment of the connector assembly of the present invention; and FIG. 7 is a side view, partially in section, of the connector assembly of FIG. 6.

DESCRIPTION OF THE PREFERRED EMBODIMENTS

The connector assembly of the present invention is intended to work best with a transducer of the type already described, i.e., one that is very thin in profile which lends itself to vibration upon electrical excitation. One example of the type of transducer that can be used is shown in FIG. 2 of the drawings in the form of a circular disc. It is understood, however, any generally thin shaped form could be used and still work in the connector assemblies to be described hereinafter.

Turning to FIG. 2 in greater detail, the transducer, generally designated 10, is seen to include a piezoelectric element 12 which is mounted on a larger substrate 14 made out of conductive material such as brass. If a feedback circuit is desired, the piezoelectric element 12 will have an electrically isolated island 16. The electrical island 16 is then connected to the feedback circuit.

Turn now to FIGS. 1 and 3 in greater detail, one connector assembly of the present invention, generally designated 20, is seen to be connectable to a printed circuit board 22. The printed circuit board has a plurality of mounting holes 24 and terminal holes 26.

The connector assembly 20 includes a base member, generally designated 28, including a housing portion 30 having depending mounting hooks 32 and snap protrusions 34 formed thereon. The mounting hooks are adapted to be snap fit into the mounting holes 24 formed in the printed circuit board 22. This mounting would be preliminary to any soldering operation as will be described in greater detail hereinafter.

The inside of the base member 28 has an upstanding nodal circular support 36 on which the transducer 10 is adapted to rest. It is to be noted that the support 36 has a knife-like edge to approximate a line contact only on the bottom of the transducer 10.

A plurality of vertical positioning ribs 38 are formed on the interior wall of the housing 30. These ribs 38 will locate the transducer so that it will not touch the interior housing wall which might dampen any vibration which is produced by the transducer 10.

The interior of the base member housing 30 includes three terminal cavities 40, 42 and 44 which are adapted to mount three resilient terminals 46, 48 and 50, respectively therein. Each terminal 46, 48 and 50 has a locking tang 52 formed thereon to abut against the shoulder 54 formed in the cavities 40, 42 and 44 to lock the terminals therein. It is to be noted that the terminals when initially mounted in the respective terminal cavities will extend above the height of the circular support 36 and will be resiliently pressed downwardly with the downward force provided on the transducer 10.

In order to provide the downward force and, therefore, the electrical connection with the terminals, a cover, generally designated 56, is provided. The cover 56 is in the form of an open ended cylindrical housing 58 having an opening 60 in its top and a plurality of snap latches 62 which are adapted to cooperate with the snap protrusions 34 formed on the base housing 30.

The inside of the cover housing 56 has a depending circular nodal ridge 64 which is in alignment with the circular support ridge 36 formed in the base member 28. The depending ridge 64 divides the cover housing 58 into a central resonating chamber 66 surrounded by an annular chamber 68.

It is important to note that the diameter of the circular support ridge 36 and the depending ridge 64 is designed to be substantially the same as the nodal diameter of the transducer 10. This nodal point or diameter is the place where the transducer 10 would naturally vibrate. Therefore, if the transducer is held at this point, the least amount of dampening effect will result to produce the greatest amount of vibration and sound. In addition, for the purposes of preventing dampening, the terminals 46, 48 and 50 should be resilient so that a greater unimpeded vibration is generated. To amplify the sound, the resonating chamber 66 is provided while still remaining in contact with the transducer 10. However, even though all of these features would be necessary to produce the optimum amount of sound, it is not necessary to provide these features if an application of a lesser sound output is desired.

In use, the entire assembly 20 can be preassembled prior to any manufacturing operation. First, the terminals 46, 48 and 50 are mounted in their respective terminal cavities 40, 42 and 44 respectively. Then, the transducer 10 is placed with the piezoelectric element 10 facing downward onto the resilient terminals 46, 48 and 50 and the circular support ridge 46. The cover 56 is then snap fit onto the base member 28 so that the respective snap protrusions 34 cooperate with the respective snap latches 62.

When the assembly is completed, it is placed on the printed circuit board 22 initially so that the mounting hooks 32 are received in their respective holes 24. The printed circuit board 22 is then wave soldered to produce solder joints 70 to electrically connect circuitry (not shown) on the printed circuit board 22 with the transducer 10.

If, for any reason, it is desired to replace the transducer 10, the cover 56 is removed by unlatching the snap latches 62 from the snap protrusions 34. This operation can be performed many times.

Turning now to FIGS. 4 and 5 and in greater detail, another embodiment of a connector assembly, generally designated 80, is shown mountable to a printed circuit board 82. The printed circuit board 82 has a plurality of mounting holes 84 and terminal holes 86 for purposes which will become more apparent hereinafter.

The connector assembly 80 is seen to generally include a base member 88 having two mounting hooks 80 which are adapted to be received through the mounting holes 84. Four upstanding support members 92 extend from the base member 88 which provide a platform for the transducer 10 when it is mounted on the base member 88. Two upstanding clamp members 94 are provided to clamp the transducer 10 in the base member 88. The combination of the four supports 92 and the two clamp members 94 comprise a holding means for the transducer 10.

The base member 88 has three terminal cavities 96, 98 and 100 which are adapted to receive three terminals 102, 104 and 106, respectively therein. Each of the terminals 102, 104 and 106 has a locking tang 108 which is adapted to engage a shoulder 110 formed in each of the cavities 96, 98 and 100. In this manner each terminal 102, 104 and 106 is locked within their respective cavity.

It is to be noted that the terminals 102, 104 and 106 are resilient and, when they are in the base member 88 before the mounting transducer 10, extend a height greater than the height of the four upstanding supports 92. When the transducer is held in the holding means, the terminals are resiliently pressed downwardly.

In order to facilitate insertion and removal of the transducer 10 a pair of cut outs 112 are provided on opposite sides of the transducer 10 which are alignable with each clamp member 94.

In use, the terminals 102, 104 and 106 are mounted in their respective terminal cavities 96, 98 and 100. At the base member 88 is then mounted on the printed circuit board 82 by inserting the mounting hooks 90 into the respective mounting holes 84 in the printed circuit board. When this occurs, the bottom portion of the terminals 102, 104 and 106 extend below the surface of the printed circuit board 82.

The printed circuit board then can be wave soldered producing a permanent solder joint 114 with each of the terminals 102, 104 and 106. The transducer 10 is then mounted on the base member by aligning the cut outs 112 with the clamping members 94 and pressing downwardly.

It is understood that it is not necessary to have a three terminal feedback system. A noise can be produced by using the conventional two terminal system.

Turning now to FIGS. 6 and 7 in greater detail, another connector assembly, generally designated 120, falling within the scope of the invention is shown in association with a printed circuit board, generally designated 122. The printed circuit board has three apertures 124, 126 and 128 formed therein for purposes which will become more apparent hereinafter.

The connector assembly 120 is seen to include an integrally formed unitary base member, generally designated 129, made of electrically conductive material. The base member 129 can be stamped and formed to the structure which is described in greater detail hereinafter.

The base member 129 has four upstanding support surfaces 130 and two end panels 131 formed therefrom. Each of the end panels 131 has a pair of top support tabs. The support surfaces 130 and the support tabs 132 comprise a holding means to hold the transducer 10 in the base member 129.

A pair of depending terminal tabs 134 and 136 are struck from the base member 129 and bent downwardly in an area below the end panels 131. The terminal tabs 134 and 136 are each adapted to be received in the apertures 124 and 126 respectively. Each of the terminal tabs 134 and 136 have an outward bend 137 formed therein to provide a preliminary mounting means for the base member 129 in the printed circuit board 122 when received in the apertures 124 and 126. Because the entire base member is unitary and made of conductive material, the terminal tabs 134 and 136 are electrically connected to the holding means which comprise the support surface 130 and the support tabs 132.

The base member 129 also has a frangible portion 138 formed therewith. The frangible portion has a depending tab 140 which is adapted to be received in the printed circuit board aperture 128. Formed on top of the frangible portion 138 is a resilient contact 142 which is adapted to contact the piezoelectric element 12.

For reasons which will become more apparent hereinafter, it is necessary that the frangible portion be electrically isolated from the remainder of the base member 129. To this end there is provided a preformed breakaway line 144 for breaking the frangible portion 138 from the base member 129.

In use, the base member 129 which is an integral unitary form is mounted on the printed circuit board 122 so that terminal tabs 134 and 136 are received through apertures 124 and 126 and depending tab 140 is received in aperture 129. The bends 137 in the terminal tabs 134 and 136 will prevent the base member 129 from dislodging from the printed circuit board 122. The printed circuit board 122 is then wave soldered resulting in three solder joints 146. The frangible portion 138 is then broken away at the break-away line 144 from the remainder of the base member 129 to make it electrically isolated therefrom.

The conductive substrate 14 of the transducer 10 is mounted in the holding means between the respective support surfaces 130 and support tabs 132. In this configuration, the holding means contact the conductive substrate 14 of the transducer 10 which is electrically connected to the terminal tabs 134 and 136. The frangible portion 138 is in contact with the piezoelectric element 12. In this manner, an extremely low cost transducer connector assembly is provided.

We claim:

1. A connector assembly for supporting a piezoelectric transducer disc in a position generally parallel to and spaced above a surface of a printed circuit board, said connector assembly comprising:
    a unitary formed conductive body having
        a base structure;
        first tab means extending downwardly from said base structure for connection to the printed circuit board and for positioning said base structure adjacent said printed circuit board surface;
        a plurality of disc holding means extending upwardly from said base structure engageable with the periphery of the disc at spaced locations around the disc periphery for releasably supporting the disc above the base means and for electrically contacting the disc periphery;
        a contact supporting portion;
        additional tab means extending downwardly from said contact supporting portion for connection to the printed circuit board and for positioning said contact supporting portion adjacent said printed circuit board surface;
        a resilient contact extending upwardly from said contact supporting portion and adapted to electrically and resiliently engage said disc at a region spaced inwardly from the disc periphery; and
        a frangible portion interconnecting said base structure and said contact supporting portion, said frangible portion being separable from said conductive body for electrically isolating said contact supporting portion from said base structure.

2. The connector assembly of claim 1 wherein most of said base structure, said contact supporting portion and all of said tab means are beneath a disc supported by said holding means.

3. The connector assembly of claim 1 wherein two of said holding means are movable toward and away from one another in a plane generally parallel to the printed circuit board surface for selectively holding or releasing the disc.

4. The connector assembly of claim 1 further comprising a preformed break-away line between said frangible portion and said base structure.

5. The connector assembly of claim 1, said base structure including a pair of support portions generally parallel to one another and each supporting a pair of said holding means at opposite ends of said support portions.

6. The connector assembly of claim 5, said base structure further including tie means extending between said support portions.

7. The connector assembly of claim 6, said first tab means comprising a pair of tabs spaced apart from one another.

8. The connector assembly of claim 7, said pair of tabs each extending from one of said support portions.

9. The connector assembly of claim 5, said frangible portion extending between said support portions, and said contact supporting portion extending from a region of said frangible portion between said support portions.

10. A connector assembly for holding a thin, wafer-like transducer including a piezoelectric element mounted on a first side of a conductive substrate and for making electrical connections between the transducer and a circuit member, said connector assembly comprising:
a unitary, one-piece base member including
transducer supporting structure engageable with the first side of said transducer to support said transducer on the base member,
a pair of spaced apart terminal supporting surfaces facing toward said first side of the transducer and being aligned respectively with the piezoelectric element and the conductive substrate of the transducer, and opening means extending away from said terminal supporting surfaces to the exterior of said base member;
a pair of spaced-apart one-piece, metal resiliently formed terminals mounted in said base member, each terminal including
a first portion abutting one said terminal supporting surface,
a second portion extending in the direction of the transducer initially beyond the transducer supporting structure, and electrical connecting means extending from said first portions through said opening means for connection to the circuit member; and
holding means engageable with the transducer supporting structure for holding the transducer against the transducer supporting structure and for resiliently compressing said terminals between the transducer and said terminal supporting surfaces.

11. The connector assembly of claim 10 wherein said transducer supporting structure comprises a circular support corresponding with a nodal region of the transducer and wherein said holding means comprises a cover engageable with said base member and having a circular ridge engageable with a second side of the transducer opposite said circular support.

12. The connector assembly of claim 11 further comprising snap latch means defined on said cover and base member for releaseably securing said cover to said base member.

13. The connector assembly claim 10 wherein said transducer supporting structure comprises a plurality of upstanding support members defining a platform for said first side of the transducer, and wherein said holding means comprises a plurality of clamp members defined by said base member and engageable with edge regions of the transducer.

14. The connector assembly of claim 10 wherein said opening means comprises a pair of terminal receiving cavities, and said electrical conducting means comprises integral segments of said terminals extending to the exterior of said base member.

15. A connector assembly for mounting a thin, wafer-like transducer on a circuit board member and for electrically interconnecting the transducer and the circuit board member, said connector assembly comprising:
a base member including
depending mounting elements engageable with the circuit board member for attaching said base member to the circuit board member,
transducer supporting structure for engaging a first surface of the transducer,
a pair of terminal receiving cavities extending in the direction of said mounting elements to the exterior of said base member, and
a terminal support surface adjacent each said terminal receiving cavity, said support surfaces facing toward said first surface of the transducer;
a one-piece conductive terminal received in each said terminal receiving cavity and including
a resiliently formed portion initially extending from said terminal support surface beyond said transducer supporting structure which is adapted to be resiliently compressed between the transducer and said terminal support surface when the transducer is held against the transducer supporting structure, and
an electrical connecting portion extending through the corresponding terminal receiving cavity to the exterior of said base member and adapted to electrically contact the circuit board member; and
releaseable holding means selectively engageable with said transducer for releaseably holding said transducer against said transducer supporting structure.

16. The connector assembly of claim 15 wherein said transducer supporting structure comprises a circular support corresponding with a nodal region of the transducer and wherein said holding means comprises a cover engageable with said base member and having a circular ridge engageable with the second side of the transducer opposite said circular support.

17. The connector assembly of claim 15 wherein said transducer supporting structure comprises a plurality of upstanding support members defining a platform for said first side of the transducer, and wherein said holding means comprises a plurality of clamp members defined by said base member and engageable with edge regions of the transducer.

* * * * *